US012627121B2

(12) United States Patent (10) Patent No.: US 12,627,121 B2
Seff et al. (45) Date of Patent: May 12, 2026

(54) MARINA POWER PEDESTAL INCLUDING MARINA SAFETY STATUS INDICATION DEVICE

(71) Applicant: EATON INTELLIGENT POWER LIMITED, Dublin (IE)

(72) Inventors: Paul D. Seff, Williamsburg, VA (US); Mark W. Mosser, Williamsburg, VA (US); Greg Storck, Williamsburg, VA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 224 days.

(21) Appl. No.: 18/640,379

(22) Filed: Apr. 19, 2024

(65) Prior Publication Data

US 2025/0329233 A1 Oct. 23, 2025

(51) Int. Cl.
| | |
|---|---|
| *H02B 1/50* | (2006.01) |
| *G01R 31/52* | (2020.01) |
| *H05B 47/17* | (2020.01) |
| *G08B 5/36* | (2006.01) |

(52) U.S. Cl.
CPC .............. *H02B 1/50* (2013.01); *G01R 31/52* (2020.01); *H05B 47/172* (2024.01); *G08B 5/36* (2013.01)

(58) Field of Classification Search
CPC .. G08B 5/36; G01R 19/165; G01R 19/16533; G01R 31/52; G01D 1/00; G01D 3/04; H02B 1/50; H05B 45/20; B63B 35/44; B63B 75/00; B63G 8/00; B63G 8/001; F03B 13/20; F03B 13/22
See application file for complete search history.

(56) References Cited

U.S. PATENT DOCUMENTS

| | | | | |
|---|---|---|---|---|
| 11,519,380 | B1 * | 12/2022 | Chang ..................... | F03B 13/22 |
| 2021/0047018 | A1 * | 2/2021 | Williams .................. | B63C 9/00 |
| 2021/0082591 | A1 * | 3/2021 | Cella ...................... | B63B 75/00 |
| 2025/0065995 | A1 * | 2/2025 | Complita ................ | B63B 35/44 |

* cited by examiner

*Primary Examiner* — Van T Trieu
(74) *Attorney, Agent, or Firm* — Eckert Seamans Cherin & Mellott, LLC

(57) ABSTRACT
A power pedestal includes: a pedestal member comprising a base structured to be attached to a platform and an enclosure extending from the base; a leakage current detection unit structured to detect a leakage current in the water in a slip and to output a leakage current detection signal based on the detected leakage current; and a marina safety status indication unit comprising: a control circuit connected to the leakage current detection circuit and structured to determine a real time marina safety status in the water within the slip and to output a marina safety status signal based on the determination; and a marina safety status indication device including a rub rail and a marina safety status indicator embedded in the rub rail and connected to the control circuit, the marina safety status indicator structured to provide the real time marina safety status based on the marina safety status signal.

20 Claims, 6 Drawing Sheets

16 —
Output Power
Receptacles

18 —
Ground Fault
Breaker

12 —
| L1 | L2 | N |
G

MARINA POWER PEDESTAL INCLUDING MARINA SAFETY STATUS INDICATION DEVICE

FIELD OF THE INVENTION

The disclosed concept relates generally to a power pedestal and more particularly, a marina power pedestal.

BACKGROUND OF THE INVENTION

U.S. Pat. No. 6,844,716 discloses a utility distribution pedestal for marine and recreational vehicles.

Stray or leakage electric current is a portion of current that flows over a path other than the intended path. When power pedestals are employed in marina applications, stray currents can end up in the water in the vicinity of the power pedestal. Stray currents in marinas are extremely dangerous and have led to a number of fatalities due to electrocution or electric shock drowning (ESD). ESD is a condition where a person in the water is subjected to a paralyzing electrical shock, which in turns leads to the person drowning.

Leakage currents are not visible, so if a stray current does exist in the vicinity of a power pedestal in a marina, it is likely to go undetected. Due to its lack of detection, the dangerous condition in the water will remain unfixed. Additionally, people around the marina will not be aware of the dangerous condition in the water and may not exercise due care in avoiding the water.

There is room for improvement in marina power pedestals.

There is room for improvement in marina leakage current monitors and marina safety indicators.

SUMMARY OF THE INVENTION

These needs, and others, are met by power pedestal structured to be attached to a slip of a platform in the vicinity of water. The power pedestal includes: a pedestal member that comprises a base structured to be attached to the platform and an enclosure extending from the base; a leakage current detection unit structured to detect a leakage current in the water in a slip and to output a leakage current detection signal in response to detecting the leakage current in the water within the slip; and a marina safety status indication unit. The marina safety status indication unit includes a control circuit electrically connected to the leakage current detection circuit, the control circuit being structured to determine a real time marina safety status in the water within the slip based on the leakage current detection signal and predefined leakage current danger levels and to output a marina safety status signal based on the determination; and a marina safety status indication device including a rub rail structured to be fixedly attached to one or more edges of the slip, a cord, and a marina safety status indicator embedded in the rub rail and electrically connected to the control circuit via the cord, the marina safety status indicator being structured to provide the real time marina safety status based on the marina safety status signal.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
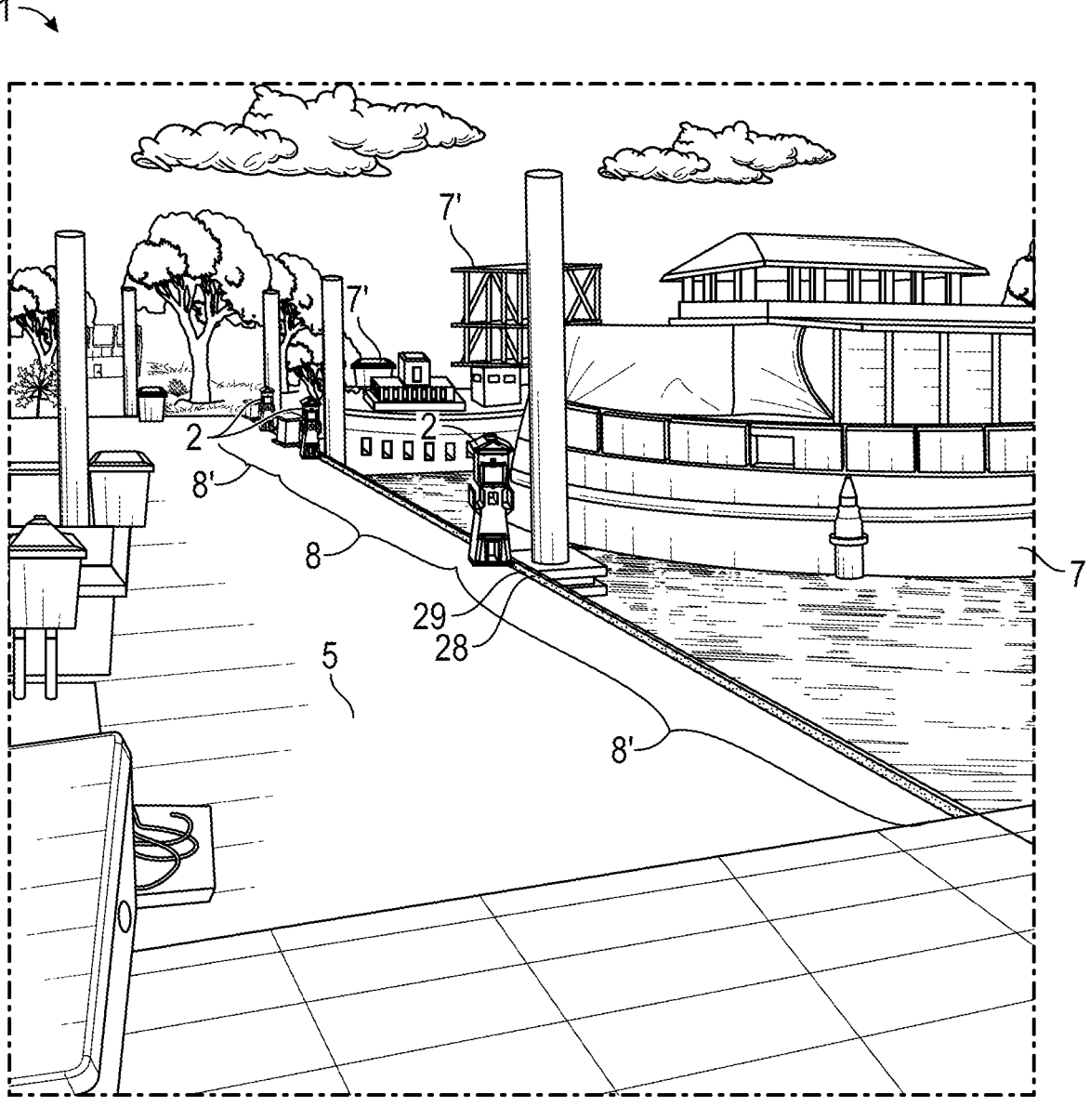
FIG. 1 is a perspective view of a marina including a marina power pedestal including a leakage current detection unit and a marina safety status indication unit in accordance with a non-limiting, example embodiment of the disclosed concept.
Figure 2:
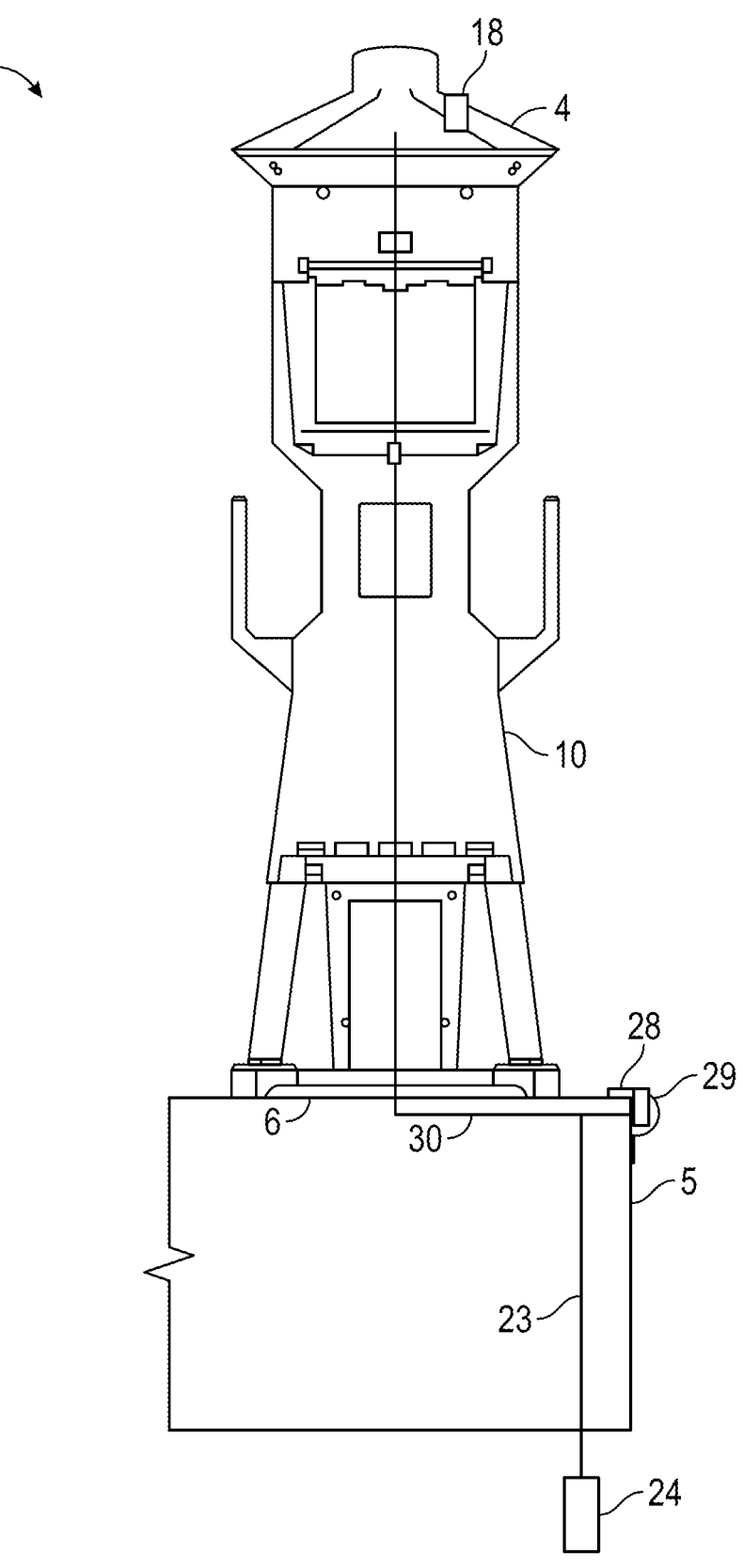
FIG. 2 is a partial side view of the marina power pedestal of FIG. 1.
Figure 3:
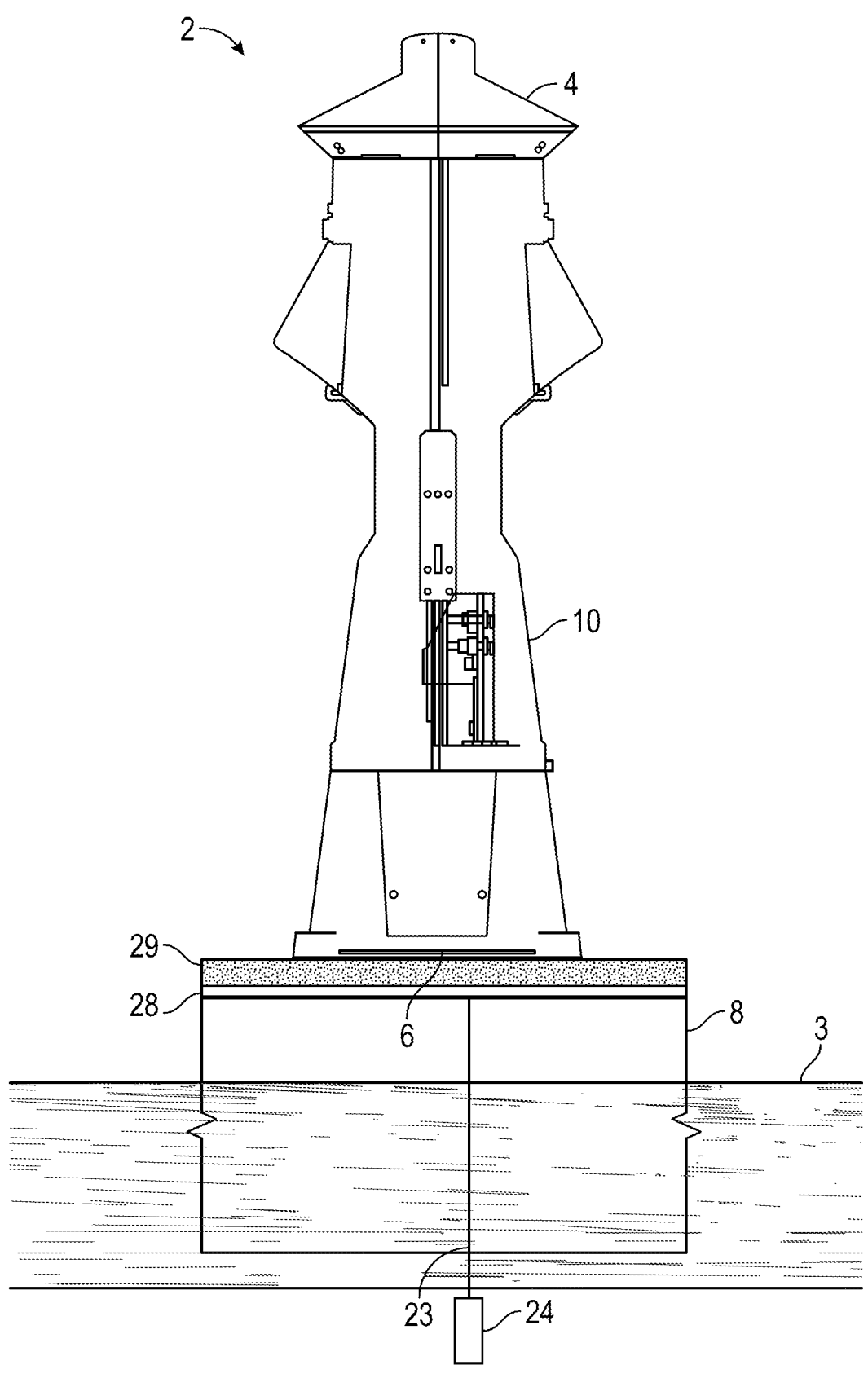
FIG. 3 is a back view of the marina power pedestal of FIG. 1.
Figure 4:
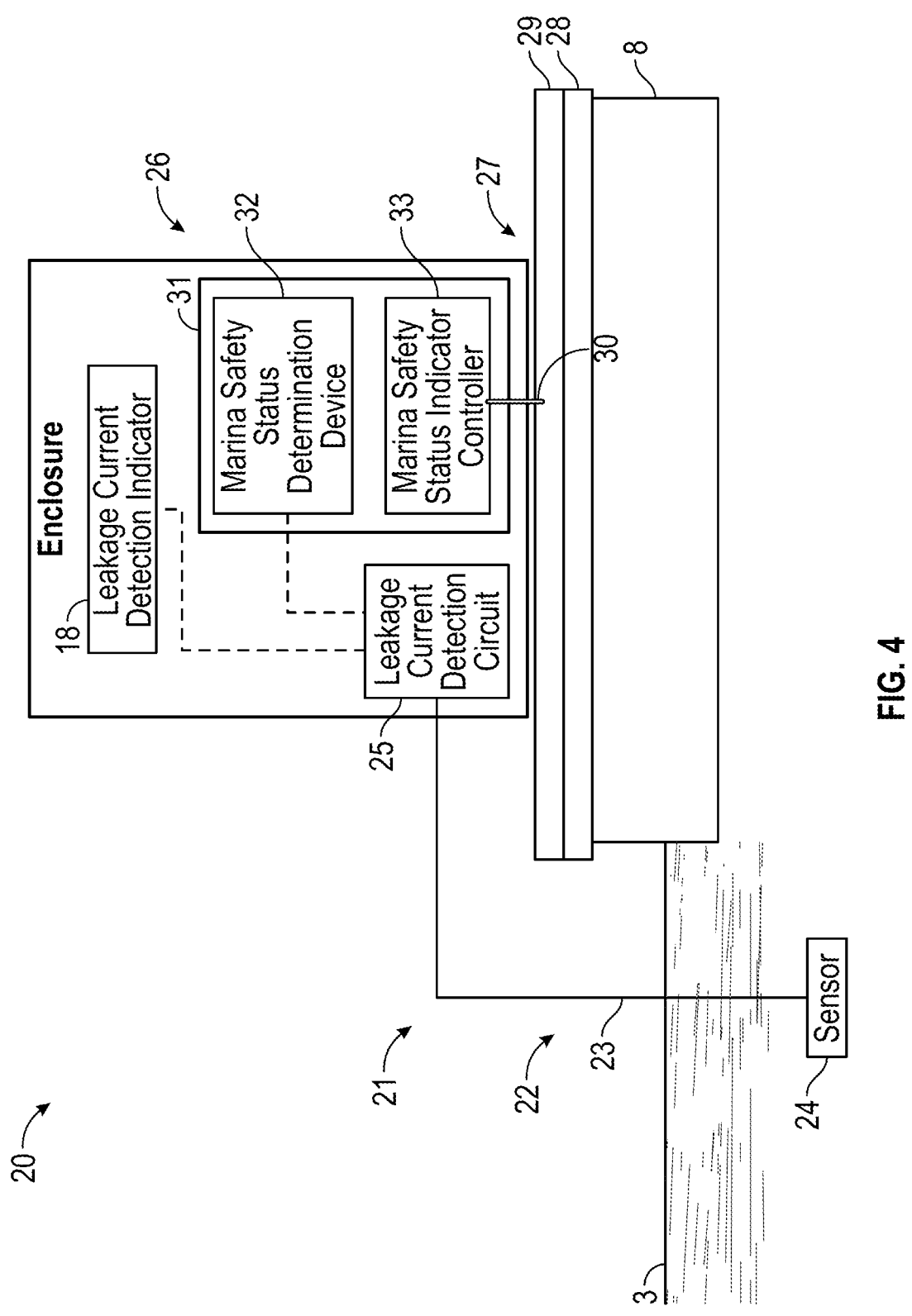
FIG. 4 is a schematic diagram of an exemplary marina safety status indication unit of the power pedestal of FIG. 1.

As employed herein, the term "vehicle" shall expressly include, but not be limited by, a land vehicle, a marine vehicle, an air vehicle or another motor vehicle.

As employed herein, the term "land vehicle" shall expressly include, but not be limited by, any land-based vehicles having pneumatic tires, any rail-based vehicles, any maglev vehicles, automobiles, cars, trucks, station wagons, sport-utility vehicles (SUVs), recreational vehicles, construction vehicles, off road vehicles, all-terrain vehicles, farm vehicles, fleet vehicles, motor homes, vans, buses, motorcycles, mopeds, campers, trailers, or bicycles.

As employed herein, the term "marine vehicle" shall expressly include, but not be limited by, any water-based vehicles, ships, boats, other vessels for travel on water, submarines, or other vessels for travel under water.

As employed herein, the term "air vehicle" shall expressly include, but not be limited by, any air-based vehicles, airplanes, jets, aircraft, airships, balloons, blimps, or dirigibles.

As employed herein, the term "number" shall mean one or an integer greater than one (i.e., a plurality).

As employed herein, the term "platform" shall mean a horizontal flat surface, a raised horizontal flat surface, or a dock pier.

As employed herein, the term "pedestal" or "pedestal member" shall mean an elongated, generally upright structure.

As employed herein, the term "power pedestal" shall mean a pedestal or pedestal member structured to input power from input power terminals (e.g., utility power terminals) and output power to a number of output power receptacles.

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The disclosed concept is described in association with a marina power pedestal, although the disclosed concept is applicable to a wide range of vehicle power pedestals.

FIGS. 1-4 and 7 illustrate a marina 1 including a plurality of power pedestals disposed on a platform 5, and a plurality of vessels 7,7' docked or berthed within the water in respective slips 8, 8'. The platform 5 may be, for example and without limitation, a dock pier 5 generally divided into a plurality of slips 8,8', each slip allowing for a vessel 7,7' to be berthed or moored therein. A power pedestal may be, for example and without limitation, a marina power pedestal 2. The marina power pedestal 2 includes a pedestal member 4 having a base 6 structured to be fixed to the slip 8 and an enclosure 10 extending generally vertically from the base 6. A plurality of input power terminals 12 (shown in FIGS. 5 and 6) are mounted to the pedestal member 4 and are structured to be electrically connected to a power source (e.g., a utility power source) (not shown) by plural electrical conductors 14 (shown in FIG. 5). The marina power pedestal 2 also includes a number of output power receptacles 16 (shown in FIGS. 5 and 6) mounted to the enclosure 10.

The marina power pedestal 2 further includes a marina safety indication system 20 having a leakage current detection unit 21 and a marina safety status indication unit 26. The leakage current detection unit 21 is structured to detect a leakage current in the water 3. The leakage current detection unit 21 includes a leakage current probe 22 and a leakage current detection circuit 25 (shown in FIG. 4).

The leakage current probe 22 is structured to extend from the enclosure 10 and into the water. The leakage current probe 22 includes a cord 23 and a voltage sensor 24. The cord 23 electrically connects the voltage sensor 24 to the leakage current detection circuit 21. The voltage sensor 24 is structured to submerge in the water 3 and sense a voltage in the water.

The leakage current detection circuit 25 is electrically connected to the leakage current probe 22 and is structured to detect a leakage current based on the voltage sensed by the leakage current probe 22. In some example embodiments of the disclosed concept, the leakage current detection circuit 25 is structured to compare the voltage sensed by the leakage current probe 22 to a predetermined threshold voltage. When the voltage sensed by the leakage current probe 22 exceeds the predetermined threshold voltage, the leakage current detection circuit 25 detects the leakage current in the water 3. In response to detecting the leakage current, the leakage current detection circuit 25 outputs a leakage current detection signal to the marina safety status indication unit 26 included in the marina power pedestal 2.

The marina safety status indication unit 26 includes a marina safety status indication device 27 and a marina safety status indication control circuit 31. The marina safety status indication device 27 includes a rub rail 28, a marina safety status indicator 29 and a cord 30. The rub rail 28 is fixedly attached (e.g., glued or push-fit) to one or more edges of each slip 8,8' and structured to protect the vessel 7,7' and the platform 5 from damages caused from contacts during docking, berthing and/or environmental hardships. The marina safety status indicator 29 is disposed on or embedded in the rub rail 28 and electrically connected to the marina safety status indication control circuit 31 via the cord 30. The marina safety status indicator 29 is further structured to provide a real time safety status in response to a marina safety status signal received from the marina safety status indication control circuit 31 via the cord 30. In some example embodiments of the disclosed concept, the marina safety status indication is a visual indication and the marina safety status indicator 29 may be a light source such as, for example and without limitation, a light emitting diode (LED). The marina safety status indicator 29 may include a plurality of LED circuits (not shown) electrically connected to the marina safety status indication control circuit 31. The plurality of LED circuits may each include a plurality of colored LEDs, for example, without limitation, red, green and blue.

Figures 5, 6:
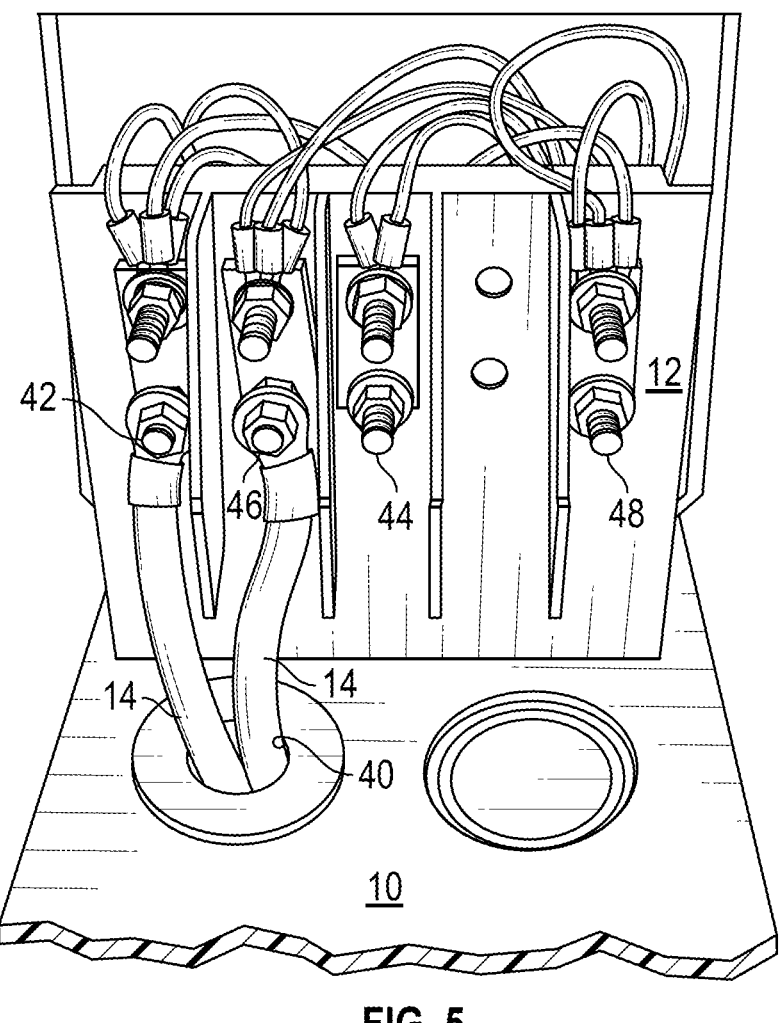
FIG. 5 is an isometric view of the input power terminals of the marina power pedestal of FIG. 1.
FIG. 6 is a schematic diagram of a ground fault protection circuit in accordance with a non-limiting, example embodiment of the disclosed concept.
Figure 7:
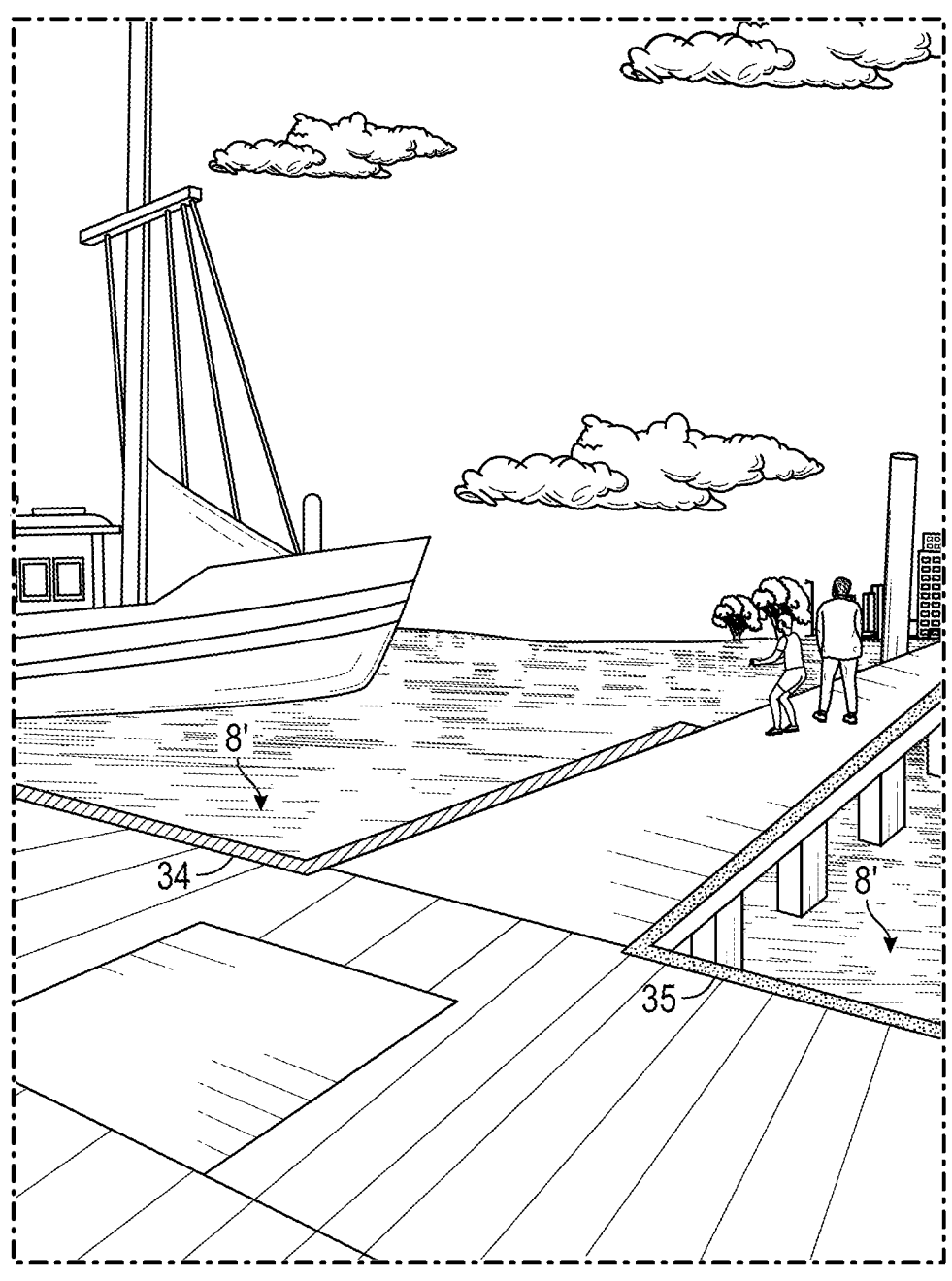
FIG. 7 illustrates various levels of real time marina safety status indicated by the marina safety status indicator of FIG. 1.

The marina safety status indicator 29 provides a real time marina safety status which is determined based on a level of danger posed to people who are in the vicinity of the water 3 having leakage current. A level of danger may be determined by the marina safety status indication control circuit 31 based on relevant local electrical standards. For example, section 555.3 of NEC 2017 requires overcurrent protective devices for marinas, e.g., ground fault protection circuit (as shown in FIG. 6), to have ground-fault protection not exceeding 30 mA. Further, a person may experience a serious effect from leakage current of as little as 10 mA. As such, it would be prudent to alert the people well in advance of reaching the 30 mA trip threshold. However, rather than limiting the real time safety status to a binary Leakage Current Detected or No Leakage Current Detected as the conventional leakage current detectors do, the marina safety status indicator 29 provides a plurality of real time marina safety statuses. The real time marina safety statuses are differentiated based on predefined leakage current danger levels and each differentiated marina safety status is color-coded. Each color corresponds to a specific range of the amount of detected leakage current in the water 3 within a slip 8,8'. For example, the marina safety status indicator 29 may exhibit color red (as shown in FIG. 7) indicating a highest danger level, color yellow (as shown in FIGS. 1 and 7) indicating an intermediate danger level, and/or color green indicating a safe level. A highest danger level may correspond to any leakage current greater than or equal to 10 mA. An intermediate danger level may correspond to any leakage current greater than 0 mA and less than 10 mA. A safe level may correspond to zero or little leakage current. It will be understood that these danger levels and corresponding leakage current ranges and/or colors are for illustrative purposes only, and thus can be changed or altered as appropriate without departing from the scope of the disclosed concept. For example, the color blue may be used to indicate a first intermediate danger level corresponding to leakage current greater than 0 mA and less than 5 mA and the color yellow may be used to indicate a second intermediate danger level corresponding to leakage current greater than or equal to 5 mA and less than 10 mA. In another example, the color pink may be used to indicate the second intermediate danger level.

Colors may be also indicative of specific location(s) of the leakage current originator, i.e., faulty wiring in a vessel 7 and/or energized underwater metals (e.g., without limitation, vessel propellers, dock frames, ladders, etc.) within the slip 8. Using the above four danger level example, a person can infer from the color blue corresponsive to the first intermediate danger level that there may be, e.g., without limitation, one or more energized underwater metals in the water within the slip 8, but not a faulty wiring in a vessel 7 berthed within the slip 8 since a faulty wiring in a vessel may generate leakage current of approximately 5 mA or 6 mA. Further, a person can infer from the color yellow corresponsive to the second intermediate danger level that there may be a faulty wiring in the vessel 7 and/or one or more energized underwater metals in the water within the slip 8.

The marina safety status indicator 29 further provides accumulative readings of leakage currents emanated from more than one vessels 7,7' and/or a plurality of energized underwater metals in the water in or in the vicinity of the slip 8. For example, as previously mentioned, the color red corresponds to a leakage current greater than or equal to 10 mA. As such, a person can infer from the color red that the vessel 7 berthed within the slip 8 and one or more vessels 7' berthed in the vicinity of the slip 8 may include a faulty wiring; that the vessel 7 berthed within the slip 8 and one or more vessels 7' berthed in the vicinity of the slip 8 include a faulty wiring and the water in and/or in the vicinity of the slip 8 includes a plurality of energized underwater metals; that a plurality of vessels 7' berthed in the vicinity of the slip 8 includes a faulty wiring; that a plurality of vessels 7' berthed in the water in the vicinity of the slip 8' includes a faulty wiring and the water within and/or in the vicinity of the slip 8 includes a plurality of energized underwater metals, or any other appropriate combination thereof. In some example embodiments, the highest danger level may be greater than or equal to 30 mA, indicating a plurality of vessels 7,7' leaking currents and/or energized underwater metals within and/or in the vicinity of the slip 8. As such, by looking at the color red or color correspondsive to the highest danger level, a person is immediately alerted that the leakage current is an accumulated reading of leakage currents emanated from more than one vessels 7,7' and/or a plurality of energized underwater metals in the water in or in vicinity of the slip 8. Thus, the color correspondsive to the highest danger level immediately identifies an area of interest (e.g., water within and the vicinity of the slip 8) and vessels to be inspected for inspection and prompts an inspector to conduct a comprehensive inspection and obtain a comprehensive resolution of the leakage current.

In some example embodiments, a visible and conspicuous sign is provided within the marina enumerating each color and corresponding danger level, leakage current range and instructions to follow. For example, the sign may enumerate that the color red, when exhibited on the marina safety status indicator 29, means a highest danger level corresponding to a highest safety risk and may also include an instruction to stay out of the water 3 and inspect the vessel 7 berthed on the slip 8 or other vessels 7' for faulty wirings and/or one or more energized underwater metals within and the vicinity of the slip 8, and so forth.

The marina safety status indication control circuit 31 may include a marina safety status determination device 32 and a marina safety status indicator controller 33. The marina power safety status indication control circuit 31 may be a processing unit that may include a processor and a memory. The processor may be, for example and without limitation, a microprocessor, a microcontroller, or some other suitable processing device or circuitry. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The memory may store predefined leakage current status levels, predefined marina safety status, predefined danger levels, color schemes correspondsive to specific leakage current ranges and marina safety statuses, and/or predefined visual or audible indications for the leakage current detection indicator 18. The marina safety status determination device 32 determines real time marina safety level based on the detected leakage current, the predefined leakage current danger levels and/or predefined danger levels. Upon determining real time marina safety level, the marina safety status determination device 32 transmits a real time marina safety status signal to the marina safety status indicator controller 33. The marina safety status indicator controller 33 then determines corresponding color for the real time marina safety status and controls the marina safety status indicator 29 (e.g., LED circuits) to emit the corresponding color. The marina safety status indicator 33 may be, e.g., RGB controllers or digital control units (e.g., without limitation, microcontrollers) structured to customize colors corresponding to the real time marina safety status based on user preferences.

As previously mentioned, the marina safety status indicator 29 is disposed on or embedded in the rub rail 28, which is in turn disposed on one or more edges of a slip 8,8' in which one vessel 7,7' is berthed. Thus, the marina safety status indication is easily observable from outside the enclosure 10 so that people can be made aware of a leakage current condition and corresponding marina safety status in the water 3 within or in the vicinity of the slip 8. Further, the indication provides the per slip indication of the marina safety status, allowing immediate identification of the origin(s) of the leakage current, and/or accumulative readings of the leakage currents, immediately identifying an area of interest and/or one or more vessels for inspection and prompting a comprehensive inspection and resolutions of the leakage current.

In some example embodiments, the marina pedestal 2 may also include a leakage current detection indicator 18 electrically connected to the leakage current detection circuit 25. The leakage current detection indicator 18 is structured to provide an indication in response to the leakage current detection signal. In some example embodiments of the disclosed concept, the indication is a visual indication and the indicator 18 may be a light source such as, for example and without limitation, an LED. In some other example embodiments of the disclosed concept, the indicator 18 may provide an audible indication such as a sound. The indication is disposed on the top surface or within the enclosure 10 such that the leakage current detection indication is observable from outside the enclosure 10 so that people can be made aware of a leakage current condition in the water 3 around the marina power pedestal 2. In some example embodiments of the disclosed concept, additional indicator 18 may provide an additional visual or sound indication.

In some example embodiments of the disclosed concept, the marina power pedestal 2 further includes a number of circuit interrupters, such as, for example and without limitation, circuit breakers 18 having a ground fault circuit interruption capability (shown in FIG. 6). In some other example embodiments of the disclosed concept, the marina power pedestal 2 does not include a ground fault circuit interruption capability.

Referring to FIG. 5, the input power terminals 12 of the marina power pedestal 2 of FIG. 1 are shown. These terminals 12 include a first line terminal 42 (LINE1), a second line terminal 44 (LINE2), a neutral terminal 46 and a ground terminal 48. As shown by the two example electrical conductors 14, the terminals 42,44,46,48 are structured to be electrically connected to a suitable power source (not shown) by those conductors, which extend through the opening 40. It will be appreciated that the other terminals 44,48 may also be electrically connected to the power source by other electrical conductors (not shown). The other electrical conductors 12 are electrically connected to the circuit breakers 18 and the output power receptacles 16.

Referring to FIG. 6 of a schematic diagram of a ground fault protection circuit is shown. The ground fault protection circuit includes the input power terminals 12, the output power receptacles 16 and the circuit breakers 18 with ground fault capability. In example embodiments of the disclosed concept where the marina power pedestal 2 does not provide ground fault protection, the circuit breakers 18 with ground fault protection are omitted. In some example embodiments of the disclosed concept, the circuit breakers 18 with ground fault protection may be replaced with circuit breakers without ground fault protection.

Leakage currents are an issue associated with marina power pedestals that do not include ground fault protection. The disclosed concept is particularly applicable to marina power pedestals that do not include ground fault protection. However, the disclosed concept may also be applied to marina power pedestals that include ground fault protection. The leakage current detection unit 21 allows for detection of leakage currents in the case that the ground fault protection in the marina power pedestal has failed. Additionally, the leakage current detection circuit 25 may detect leakage currents that were caused by other marina power pedestals 2' in the area.

As previously described, the input power terminals 12 are mounted to the pedestal member 4 and are structured to be electrically connected to a power source (e.g., a utility power source) (not shown). The input power terminals 12 are electrically connected to the output power receptacles 16. In more detail, NEUTRAL and GROUND electrical connections of the input power terminals 12 are electrically connected to the output power receptacles 16 and LINE1 and LINE2 electrical connections of the input power terminals 12 are electrically connected to the output power receptacles 16 via the circuit breakers 18. The circuit breakers 18 have the capability of detecting a ground fault on the power circuit. When one of the circuit breakers 18 detects a ground fault, it trips open, electrically disconnecting the corresponding output power receptacle from LINE1 or LINE2.

FIG. 7 illustrates a plurality of marina safety status indicators 29 each indicating different marina safety statuses 34, 35 per slip 8'. For example, the marina safety status 34 may indicate the highest danger level corresponsive to, e.g., without limitation, leakage current greater than or equal to 10 mA. The marina safety status 35 may indicate a first intermediate danger level corresponsive to, e.g., without limitation, leakage current greater than or equal to 5 mA and less than 10 mA. It will be understood that there may be more and/or different marina safety statuses and corresponding colors as described with reference to FIGS. 1-4.

Therefore, the marina safety indication system 20 monitors real time leakage current status on a per slip basis, allowing for an immediate identification of a vessel leaking current. Further, the marina safety indication system 20 provides accumulative readings of leakage currents emanating from one or more vessels such that when the detected leakage current in the water within a slip 8 is more than 10 mA, it can be inferred that one or more vessels 7,7' may be leaking current and/or the water within or in the vicinity of the slip 8 may include energized underwater metals, thereby immediately identifying an area of interest and one or more vessels for inspection and prompting a comprehensive inspection and resolution of the accumulated leakage currents. The conventional leakage current monitors that exist as a stand-alone or portable units do not provide such per slip leakage current monitoring, and thus do not offer an ability to immediately identify the vessel leaking current. The conventional leakage current monitors do not provide accumulative readings that allow for an identification of an area of interest and one or more vessels to be inspected or prompt a comprehensive inspection and resolution of the accumulated leakage currents.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A power pedestal structured to be attached to a platform in the vicinity of water, the power pedestal comprising:
   a pedestal member that comprises a base structured to be attached to the platform and an enclosure extending from the base;
   a leakage current detection unit structured to detect a leakage current in the water in a slip and to output a leakage current detection signal in response to detecting the leakage current in the water within the slip; and
   a marina safety status indication unit comprising:
   a control circuit electrically connected to the leakage current detection circuit, the control circuit being structured to determine a real time marina safety status in the water within the slip based on the leakage current detection signal and predefined leakage current danger levels and to output a marina safety status signal based on the determination; and
   a marina safety status indication device including a rub rail structured to be fixedly attached to one or more edges of the slip, a cord, and a marina safety status indicator embedded in the rub rail and electrically connected to the control circuit via the cord, the marina safety status indicator being structured to provide the real time marina safety status based on the marina safety status signal.

2. The power pedestal of claim 1, wherein the marina safety status indicator is structured to provide a visual indication of the real time marina safety status per slip.

3. The power pedestal of claim 2, wherein the marina safety status indicator comprises a plurality of light emitting diodes structured to emit a color corresponding to the real time marina safety status based on the marina safety status signal.

4. The power pedestal of claim 3, wherein the marina safety status comprises a plurality of marina safety statuses, each marina safety status corresponsive to a predefined leakage current danger level.

5. The power pedestal of claim 4, wherein the plurality of marina safety statuses comprises a safe level corresponsive to zero leakage current, one or more intermediate danger levels corresponsive to one or more intermediate current leakage ranges, and a highest danger level corresponsive to a first current leakage range.

6. The power pedestal of claim 5, wherein the one or more intermediate danger levels comprise a first intermediate danger level corresponsive to a first intermediate leakage current range greater than 0 mA and less than 5 mA and a second intermediate danger level corresponsive to a second intermediate leakage current range greater than or equal to 5 mA and less than 10 mA, the first intermediate danger level indicating that the water in the slip includes one or more energized underwater metals, the second intermediate danger level indicating that the vessel berthed in the slip includes a faulty wiring and/or the water in the slip includes one or more energized underwater metals.

7. The power pedestal of claim 6, wherein the real time marina safety status per slip allows for immediate identification of the vessel berthed within the slip as the vessel emanating the leakage current.

8. The power pedestal of claim 5, wherein the first current leakage range is greater than or equal to 10 mA and indicative of accumulative readings of leakage currents emanating from more than one vessels and/or a plurality of energized underwater metals in the water within or in the vicinity of the slip.

9. The power pedestal of claim 8, wherein the accumulative readings of leakage currents allow for an immediate identification of an area of interest and/or one or more vessels to be inspected and prompt a comprehensive inspection and resolution of the accumulated leakage currents.

10. The power pedestal of claim 9, wherein the highest danger level indicates that the vessel berthed within the slip and one or more vessels berthed in the vicinity of the slip each include a faulty wiring, that the vessel berthed within the slip and one or more vessels berthed in the vicinity of the slip each include a faulty wiring and the water in and/or in the vicinity of the slip includes a plurality of energized underwater metals, that a plurality of vessels berthed in the vicinity of the slip includes faulty wirings, that a plurality of vessels berthed in the water in the vicinity of the slip includes faulty wirings and the water within and/or in the vicinity of the slip includes a plurality of energized underwater metals, or any other appropriate combination thereof.

11. The power pedestal of claim 1, wherein the control circuit comprises RGB controllers or digital control circuits structured to customize a color for each marina safety status.

12. The power pedestal of claim 1, further comprising:
a leakage current detection indicator disposed within the enclosure and electrically connected to the leakage current detection circuit and structured to provide an indication in response to the leakage current detection signal.

13. The power pedestal of claim 1, wherein the leakage current detection indicator may provide a visual or audible indication in response to the leakage current detection signal.

14. The power pedestal of claim 1, wherein the leakage current detection unit comprises:
a leakage current probe structured to extend outside the enclosure and into the water to sense a voltage in the water, and
a leakage current detection circuit electrically connected to the leakage current probe and structured to detect a leakage current in the water within the slip based on voltage sensed by the leakage current probe and to output an indicator signal in response to detecting the leakage current.

15. The power pedestal of claim 14, wherein the leakage current probe comprises:
a voltage sensor structured to sense the voltage in the water; and
a cord structured to electrically connect the voltage sensor to the stray current detection circuit, wherein the leakage current detection circuit is further structured to compare the voltage sensed by the voltage sensor to a predetermined threshold voltage and to detect the leakage current in the water within the slip when the voltage sensed by the voltage sensor exceeds the predetermined threshold voltage.

16. A marina safety status indication apparatus for use in a power pedestal including a pedestal member that comprises a base structured to be attached to a platform and an enclosure extending from the base, the apparatus comprising:
a leakage current detection unit structured to detect a leakage current in the water in a slip and to output a leakage current detection signal in response to detecting the leakage current in the water within the slip; and
a marina safety status indication unit comprising:
a control circuit electrically connected to the leakage current detection circuit, the control circuit being structured to determine a real time marina safety status in the water within the slip based on the leakage current detection signal and predefined leakage current danger levels and to output a marina safety status signal based on the determination; and
a marina safety status indication device including a rub rail structured to be fixedly attached to one or more edges of the slip, a cord, and a marina safety status indicator embedded in the rub rail and electrically connected to the control circuit via the cord, the marina safety status indicator being structured to provide the real time marina safety status based on the marina safety status signal.

17. The apparatus of claim 16, wherein the marina safety status comprises a plurality of marina safety statuses, each marina safety status corresponsive to a predefined leakage current danger level.

18. The apparatus of claim 16, wherein the marina safety status indicator is structured to provide a visual indication of the real time marina safety status per slip and comprises a plurality of light emitting diodes structured to emit a color corresponding to the real time marina safety status based on the marina safety status signal.

19. The apparatus of claim 16, wherein the marina safety status indication unit provides accumulative readings of leakage currents emanating from more than one vessel and/or a plurality of energized underwater metals in the water within or in the vicinity of the slip and wherein the accumulative readings allow for an immediate identification of an area of interest and/or one or more vessels to be inspected and prompt a comprehensive inspection and resolution of the accumulated leakage currents.

20. The apparatus of claim 16, wherein a leakage current detection unit comprises:
a leakage current probe comprising a voltage sensor structured to sense the voltage in the water and a cord structured to electrically connect the voltage sensor to the stray current detection circuit, the leakage current probe being structured to extend outside the enclosure and into the water to sense a voltage in the water, and
a leakage current detection circuit electrically connected to the leakage current probe and structured to detect a leakage current in the water within the slip based on voltage sensed by the leakage current probe and to output an indicator signal in response to detecting the leakage current.

* * * * *